US007794225B2

(12) United States Patent
Hattori

(10) Patent No.: US 7,794,225 B2
(45) Date of Patent: Sep. 14, 2010

(54) FINE MOLD AND METHOD FOR REGENERATING FINE MOLD

(75) Inventor: Atsuo Hattori, Hamamatsu (JP)

(73) Assignee: Yamaha Corporation, Shizuoka-ken (JP)

( * ) Notice: Subject to any disclaimer, the term of this patent is extended or adjusted under 35 U.S.C. 154(b) by 181 days.

(21) Appl. No.: 11/860,182

(22) Filed: Sep. 24, 2007

(65) Prior Publication Data

US 2008/0107973 A1    May 8, 2008

(30) Foreign Application Priority Data

Sep. 25, 2006    (JP) ............................. 2006-258571

(51) Int. Cl.
 *B29C 59/00* (2006.01)
 *G03F 7/26* (2006.01)
(52) U.S. Cl. ...................................... 425/385; 264/293
(58) Field of Classification Search ................. 425/385; 264/293
 See application file for complete search history.

(56) References Cited

U.S. PATENT DOCUMENTS

| 5,330,880 | A | 7/1994 | Horigome et al. | |
| 6,162,519 | A | 12/2000 | Takakuwa et al. | |
| 7,374,864 | B2 * | 5/2008 | Guo et al. | 430/302 |
| 2006/0266916 | A1 * | 11/2006 | Miller et al. | 249/134 |

FOREIGN PATENT DOCUMENTS

| EP | 0 540 843 A1 | 8/1992 |
| JP | 05-024121 | 2/1993 |
| JP | 05-241011 | 9/1993 |
| JP | 05-62254 | 12/1993 |
| JP | 2004-304097 | 10/2004 |
| JP | 2006-010797 | 12/2006 |
| WO | WO-2004/011258 A2 | 2/2004 |

OTHER PUBLICATIONS

Noritsugu Fujiwara, et al., "Development of mechanical sensor for measuring contractile force of a single myocyte," Denkigakkai Bio-Microsystem Kenkyu-kai Shiryo, BMS-05-3, pp. 10-12, May 6, 2005.
Won Mook Choi et al., *Soft-imprint Technique For Multilevel Microstructures Using Poly(dimethylsiloxane) Mold Combined With A Screen Mask*, America Institute of Physics, Applied Physics Letters, vol. 85, No. 15, Oct. 11, 2004, pp. 3310-3312.
Kanghun Moon et al., *Novel Hybrid Mold For Combined Nanoimprint And Photolithography Technique*, Elsevier, Science Direct, Microelectronic Engineering 83 (2006), pp. 889-892.

* cited by examiner

*Primary Examiner*—Maria Veronica D Ewald
*Assistant Examiner*—Robert J Grun
(74) *Attorney, Agent, or Firm*—Dickstein Shapiro LLP

(57) ABSTRACT

A fine mold comprises a regeneration target film forming a convex part of a formation surface, and a light shielding unit that is configured deeper than a bottom of the formation surface and that regenerates the regeneration target film. A manufacturing cost of a product having a three-dimensional structure can be reduced.

7 Claims, 14 Drawing Sheets

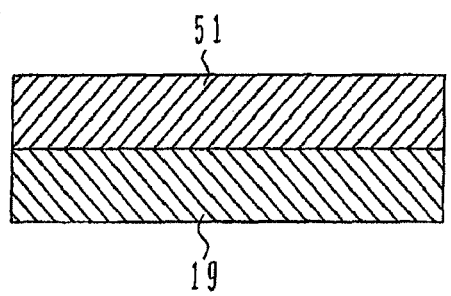
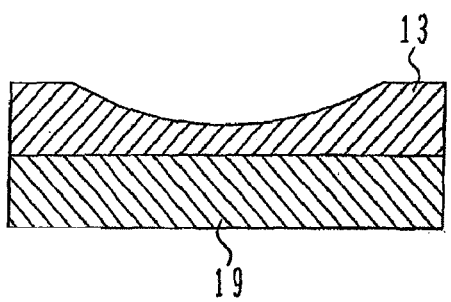
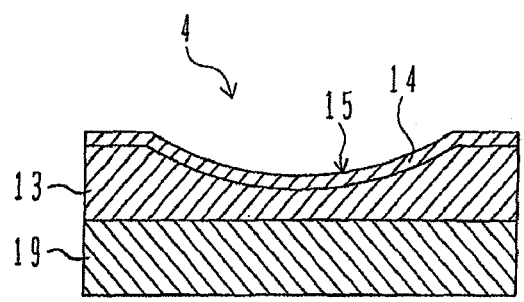

FINE MOLD AND METHOD FOR REGENERATING FINE MOLD

CROSS REFERENCE TO RELATED APPLICATION

This application is based on Japanese Patent Application 2006-258571, filed on Sep. 25, 2006, the entire contents of which are incorporated herein by reference.

BACKGROUND OF THE INVENTION

A) Field of the Invention

This invention relates to a fine mold for nanoimprinting, etc., a method for regenerating and a transferring method with the fine mold.

B) Description of the Related Art

Conventionally, a transfer imprinting method with a fine mold is well-known. For example, refer to JP H05-241011, JP 2004-304097 and FUJIWARA et al "*Tan-itsu shinkin saibo no shuushukuryoku wo sokuteisuru rikigaku sensa no kaihatsu* (Development of Dynamic Sensor for Measuring Contraction Power of Single Cardiac Myocyte)" Denkigakkai Bio-Microsystem Kenkyu-kai Shiryo, BMS-05-3, p 10-12. A product having a fine three-dimensional structure such as a storage medium, micro electro mechanical systems (MEMS), a micro lens, etc. can be manufactured at a low cost by a transfer imprinting method with the fine mold.

A fine mold may be damaged by a hard alien substance on a surface or inside of a forming material when the fine mold is pushed to the forming material. Fine molds are expensive because various types of them are manufactured only in small number by using a fine processing technique such as a photolithography technique, an electron beam exposing technique, a laser-beam direct writing method, etc.

SUMMARY OF THE INVENTION

It is an object of the present invention to reduce a manufacturing cost of a product having a three-dimensional structure.

According to one aspect of the present invention, there is provided a fine mold, comprising: a regeneration target film forming a convex part of a formation surface; and a light shielding unit that is configured deeper than a bottom of the formation surface and that regenerates the regeneration target film.

This fine mold has the light shielding unit that is configured deeper than the bottom of the forming surface to regenerate the regeneration target film forming the convex part of the firming surface, that is, the light shielding unit is configured in a layer near a reverse of the forming surface. Therefore, the fine mold can regenerate the convex part by using the light shielding unit, equipped to the fine mold, as a mask even if the convex part is damaged. That is, a fine processing technique is not necessary for this fine mold to regenerate the convex part. Therefore, a cost for manufacturing a product having a fine three-dimensional structure can be reduced by using this fine mold in comparison to the conventional fine mold.

The light shielding unit of the fine mold according to the invention may be formed of an opaque film. In this case, a convex part having a rectangle shaped cross section can be regenerated by using the light shielding unit as a mask.

The light shielding unit of the fine mold according to the invention may be a gradation mask. In this case, a forming surface of which surface is gently curved can be regenerated. For example, an opaque gray tone mask having slits below a resolution of an exposure device or a half-transparent half tone mask can be used as the gradation mask.

According to the present invention, the shallowest depth of the light shielding unit may be the same as the deepest depth of the regeneration target film. In this case, there will be no decline in a resolution caused by diffraction and dispersion when a photosensitive for forming the regeneration target film is exposed by using the light shielding unit as a mask.

The fine mold according to the present invention may further comprise a transparent protection film that is harder than the regeneration target film and configured between the forming surface and the light shielding unit. In this case, damage to the light shielding unit can be prevented so that the regeneration of the forming surface will not be impossible.

The fine mold according to the present invention may further comprise a transparent reinforcement plate having a concave part in which the light shielding unit is embedded, and the protection film may be embedded in the reinforcement plate between the light shielding unit and the forming surface and formed of transparent material having a lower refractive index than the reinforcement plate. In this case, although the light shielding unit is separated from the regeneration target film, total internal reflection happens at a side of the reinforcement plate of a boundary of the reinforcement plate and the transparent film so that there will be no decline in a resolution caused by diffraction and dispersion when a photosensitive for forming the regeneration target film is exposed by using the light shielding unit as a mask.

The fine mold according to the present invention may further comprise a transparent reinforcement plate configured at a deeper place than the light shielding unit. In this case, strength of the fine mold will increase.

According to another aspect of the present invention, there is provided a method of regenerating the above-described fine mold, comprising the steps of: removing the regeneration target film; forming a photosensitive film on a surface from which the regeneration target film is removed; and exposing the photosensitive film by using the light shielding unit as a mask to develop the photosensitive film.

According to the above-described method of regenerating the fine mold, the regeneration target film can be regenerated without forming a mask for forming the regeneration target film so that a cost for manufacturing a fine structure by the transfer imprinting method can be reduced in comparison to the conventional method. Further, in this regeneration method according to the present invention, the developed photosensitive film may be used as a regeneration target film, and a regeneration target film may be formed in an opening part of the developed photosensitive film.

The above-described method of regenerating the fine mold may further comprise the step of pushing the fine mold to forming material.

In this specification, a "forming surface" refers to a surface of a fine mold composing a boundary of forming material and the fine mold. "Transparent" a concept depending on wavelength of light; however, in this specification, "transparent" refers to a condition in which light of wavelengths to be used for exposure of a photosensitive film can pass through with little or no interruption or distortion. Similar to that, "light shielding" refer to a condition in which the light to be used for exposure is interrupted.

BRIEF DESCRIPTION OF THE DRAWINGS

FIG. 7A to FIG. 7D are cross sectional views showing a manufacturing method of a fine mold according to a fourth embodiment of the present invention.

DETAILED DESCRIPTION OF THE PREFERRED EMBODIMENTS

Figure 1A:
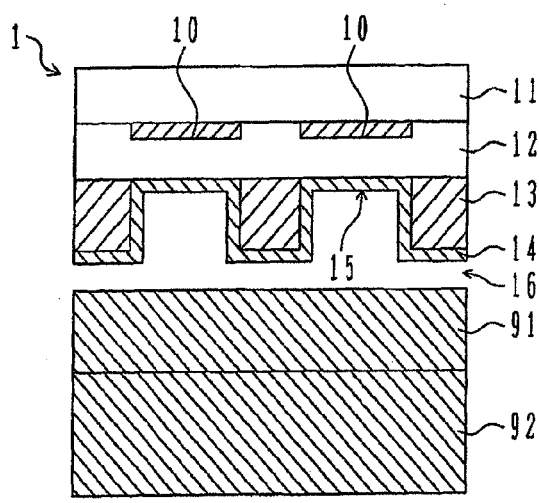
FIG. 1A to FIG. 1C are cross sectional views showing a fine mold and a transfer imprinting method by using the fine mold according to a first embodiment of the present invention.

The embodiments of the present invention will be described below with reference to the drawing's. In each embodiment, same reference numbers refer to same components, and explanations for the same components are omitted to avoid redundant.

Figure 1B:
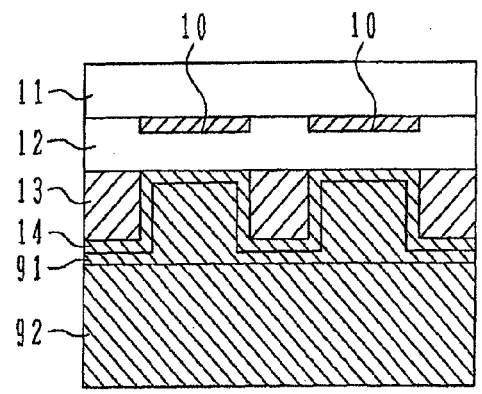
Figure 1C:
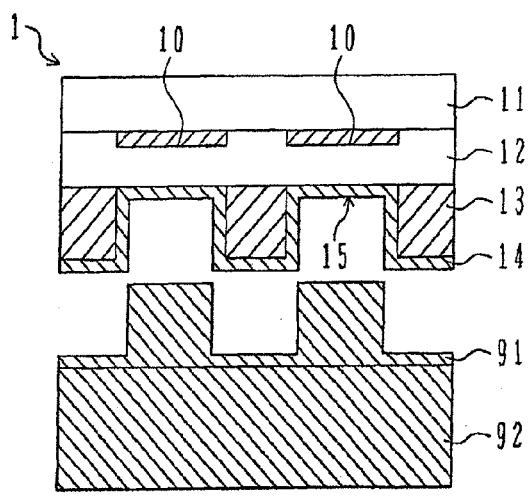

FIG. 1A to FIG. 1C are cross sectional views showing a fine mold and a transfer imprinting method by using the fine mold according to a first embodiment of the present invention.

The fine mold 1 is composed by laminating a light shielding unit 10 on a transparent substrate 11 as a reinforcement plate, a transparent protection film 12, a resin film 13 as a regeneration target film and a hard film 14. Since the light shielding unit 10 is configured on a layer deeper than a bottom of a formation surface 15 having a concave part and a convex part, a resin film 13 can be regenerated by using the light shielding unit 10 as a mask. That is, the resin film 13 can be regenerated without forming the mask by using an expensive device for patterning the resin film 13 forming the fine concave part and the convex part of the formation surface, and manufacturing cost of the fine mold is lower than that of the conventional one. The regenerating method of the fine mold 1 will be described later with explanation of its manufacturing method. Moreover, the light shielding unit 10 is not exposed on the forming surface 15 in order not to avoid damage of the light shielding unit 10 even if the forming surface is damaged by the alien substance between the fine mold 1 and the forming target substance, and not only the hard film 14 but also the protection film 12 harder than the resin film 13 are between the light shielding unit 10 and the forming surface 15.

Next, a transfer method used the fine mold 1 will be explained as an example of nanoimprinting.

As shown in FIG. 1A, a forming material 91 is applied on a surface of a substrate 92 composed of silicon wafer, etc. by spin coating, etc. Thermoplastic resin, thermosetting resin, photocurable resin or glass can be used as the forming material. Moreover, the silicon wafer can be used as the forming material.

As shown in FIG. 1B, the fine mold 1 is pushed to the forming material 91. At this time, because the forming material must be softened, the thermoplastic resin is heated to the glass transition point or more in advance. There are a method to push the forming material 91 and the fine mold 1 with two plates parallel to each other and a method to push the forming material 91 and the fine mold 1 by compressed air as the method to push the fine mold 1.

Next, the forming material 91 is formed by hardening. For example, the forming material 91 is hardened by cooling in case of the thermoplastic resin, by heating in case of the thermosetting resin, and by irradiating ultraviolet rays in case of the photocurable resin. Then, the concave part and the convex part of the forming surface 15 of the fine mold 1 are transferred to the forming material 91.

Finally, as shown in FIG. 1C, the fine mold 1 is exfoliated from the forming material 91.

FIG. 2A to FIG. 3C are cross sectional views showing a manufacturing method of the fine mold according to the first embodiment of the present invention.

First, the light shielding unit 10 is formed on the transparent substrate 11. Quartz, soda-lime glass, transparent crystallized glass, ceramics, resin, clay, alumina, sapphire, etc. can be used as the material of the transparent substrate 11. For example, thickness of the transparent substrate 11 is 2 mm. Metals such as Cr, $CrO_2$, Cu, etc., metal oxide, etc., which are opaque material to ultraviolet rays can be used for the material of the light shielding unit 10. These materials can form a film on the transparent substrate 11 by sputtering, evaporation and CVD. For example, thickness of the light shielding unit 10 is 0.1 μm. A lamination of Cr and CrOx on the quartz and the glass used as a mask and reticle can be used as a lamination of the light shielding unit 10 on the transparent substrate 11.

Figure 2A:
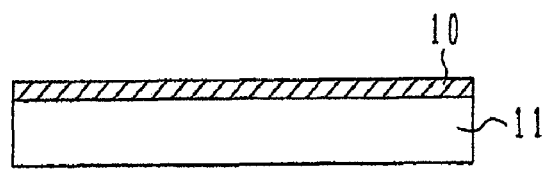
FIG. 2A to FIG. 2C are cross sectional views showing a manufacturing method of the fine mold according to the first embodiment of the present invention.
Figure 2B:
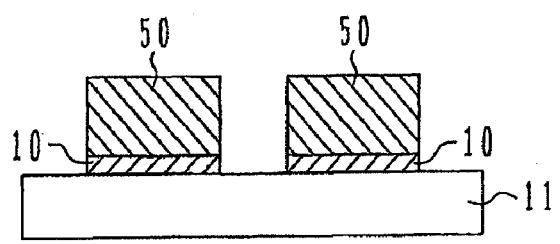

Next, as shown in FIG. 2B, the light shielding unit 10 is patterned by using a photoresist 50. For example, the photoresist 50 is exposed by a stepper, an aligner or an electron beam exposure device, and a developed pattern of the photoresist 50 is transferred to the light shielding unit 10. In the etching of the light shielding unit 10, for example, the light shielding unit 10 consisting of Cr is anisotropically etched by ion milling or cerium ammonium nitrite solution. The light shielding unit 10 may be patterned by the laser direct writing method without using the photoresist 50. In the manufacture of the mold producing various kinds and small amount with less usage times of the reticles, the laser direct writing method is effective for reducing the manufacturing cost.

Figure 2C:
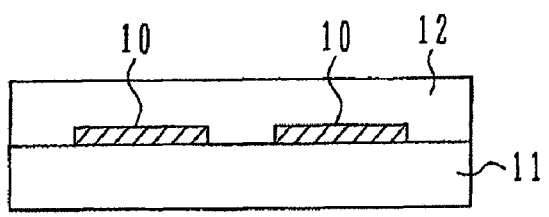

Next, as shown in FIG. 2C, the transparent protection film 12 is formed to cover the light shielding unit 10. SiN, a glass with a low-melting point, AlN, SiON, $TaO_2$, $TiO_2$, ceramics, resin, clay, etc., can be used as the material of the transparent protection film 12. It is preferable that hardness of the protection film 12 is harder than the resin film that is a regeneration target. For example, as the film-forming method, plasma CVD is used when SiN is the material. A surface of the protection film 12 may be planarized by CMP and etched-back after forming the protection film 12.

Figure 2D:
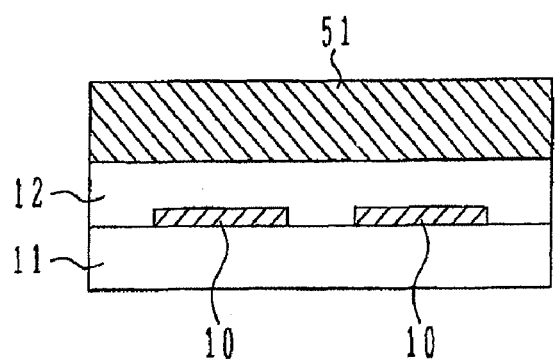

Next, as shown in FIG. 2D, the photosensitive film 51 is formed on the protection film 12. For example, the photosensitive film 51 is formed by applying a negative-typed photo resist with thickness of 70 μm to heat and harden.

Figure 3A:
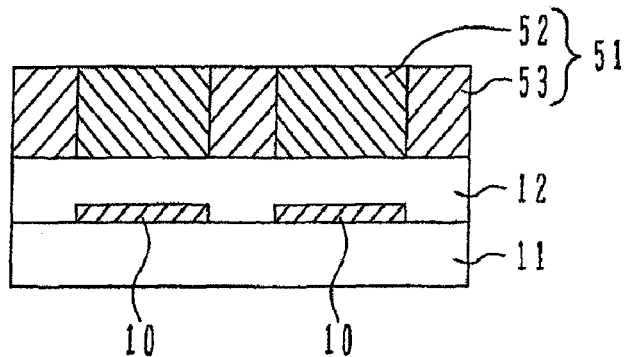
FIG. 3A to FIG. 3C are cross sectional views showing the manufacturing method of the fine mold according to the first embodiment of the present invention.

Thereafter, as shown in FIG. 3A, an ultraviolet rays is irradiated from a reverse side of the transparent substrate 11, that is, from the photosensitive film 51 of the transparent substrate 11 and the reverse side, to expose the photosensitive film 51. At this time, the photosensitive film 51 is exposed only in a exposure region 53 that is not shaded by the light shielding unit 10, and the photosensitive film 51 is not exposed in an unexposed region 52 that is shaded by the light shielding unit 10. The light used for the exposure is not limited and can be arbitrary selected corresponding to a design rule such as an ultraviolet ray, a far ultraviolet ray, a deep ultraviolet ray, an extreme ultraviolet ray and an x-ray. Of course, material of the light shielding unit 10 can be selected corresponding to wavelength of the light used for the exposure.

Figure 3B:
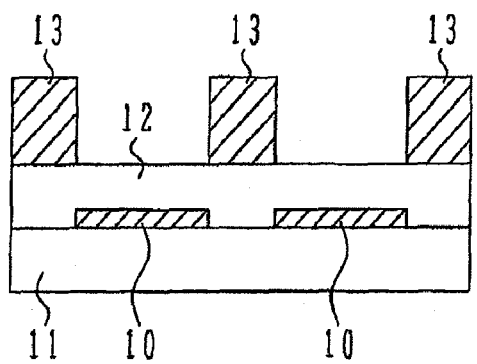

Next, when the photosensitive film 51 is developed, a resin film 13 having a fixed pattern is formed as shown in FIG. 3B. In FIG. 3B, a photosensitive region 53 of the negative-typed photoresist remains. In FIG. 3B, an example that the photosensitive region 53 becomes the resin film 13 to be the regenerating target is shown, however; needless to say, a positive-typed photoresist can be used as the photosensitive film 51.

Figure 3C:
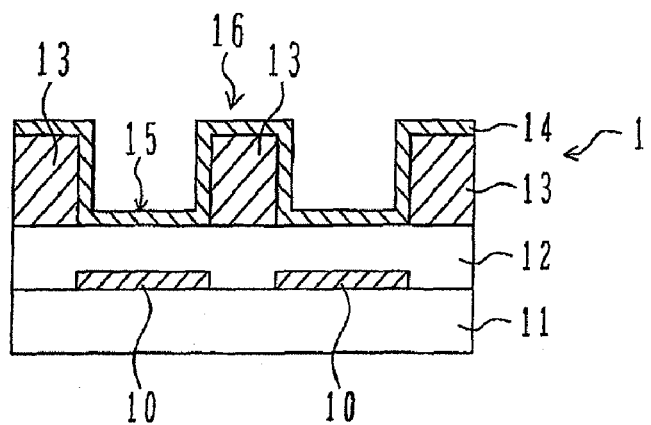

Finally, as shown in FIG. 3C, a hard film 14 is formed on a whole surface of the fine mold 1. Other inorganic material such as metal, a metal compound, ceramics, etc. can be used as the material of the hard film 14. Sputtering, plating and evaporation can be used for formation of the hard film 14. A fluorine film may be formed on the hard film 14 in order to improve mold release property on the surface of the hard film 14.

Figure 4A:
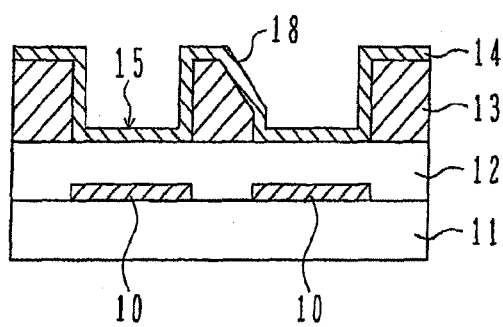
FIG. 4A to FIG. 4C are cross sectional views showing a regeneration method of the fine mold according to the first embodiment of the present invention.
Figure 4B:
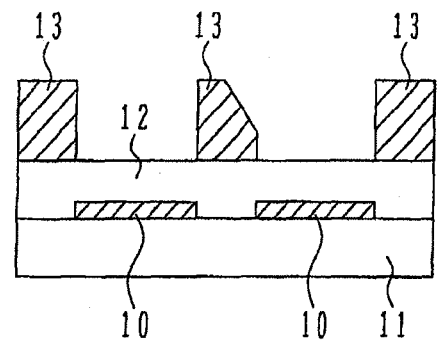
Figure 4C:
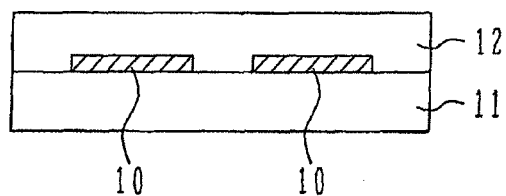

FIG. 4A to FIG. 4C are cross sectional views showing a regeneration method of the fine mold according to the first embodiment of the present invention. As shown in FIG. 4A, the hard film 14 and the resin film 13 may be deformed by alien substance between the fine mold 1 and the forming material. When the fine mold 1 is used in a state that the hard film 14 and the resin film 13 are deformed, the shape of the deformed forming surface 15 is transferred to the forming material. Since the fine mold 1 has the light shielding unit 10 as the light shielding unit on a surface deeper than the bottom of the forming surface 15, the forming surface 15 can be regenerated as described below.

First, as shown in FIG. 4B, the hard film 14 is removed. When the hard film 14 is made of Ni, the hard film can be removed by using aqueous ferric chloride solutions for etchant.

Next, as shown in FIG. 4C, the resin film 13 is removed. For example, the resin film 13 made of a photoresist is removed by using N-Methyl-2-pyrrolidone (NMP) and acetone. This state is just before forming the photosensitive film 51 shown in FIG. 2D in the manufacturing process of the fine mold 1, and after patterning the light shielding unit 10 that becomes a mask for exposing and developing the photosensitive film 51.

Then, as explained with reference to FIG. 2D, FIG. 3A, FIG. 3B and FIG. 3C, when the photosensitive film 51 is formed, and the photosensitive film 51 is exposed from the reverse side of the transparent substrate 11 to develop and form the hard film 14, the fine mold 1 is regenerated. Moreover, the protection film 12 may be removed and reformed, and the surface may be planarized before forming the photosensitive film 51. Since the stepper and reticle are not used, a processing cost after the process to form the photosensitive film 51 shown in FIG. 2D is considerably lower than a manufacturing cost in case of manufacturing the entire fine mold 1. That is, since the regeneration cost of the fine mold 1 is considerably lower than the manufacturing cost of the fine mold 1, the manufacturing cost of the substance having fine three-dimensional shape can be further lower than the conventional imprinting method by using the fine mold 1.

Figure 5A:
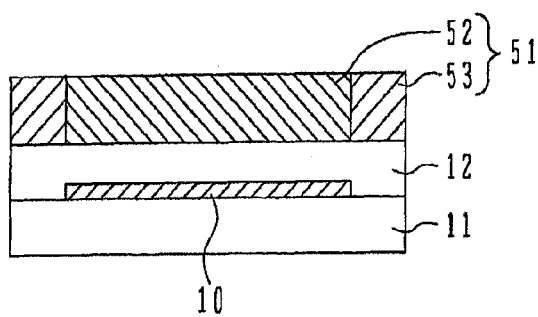
FIG. 5A to FIG. 5D are cross sectional views showing a fine mold according to a second embodiment of the present invention.
Figure 5B:
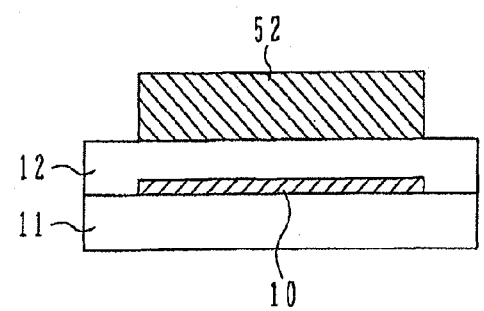
Figure 5C:
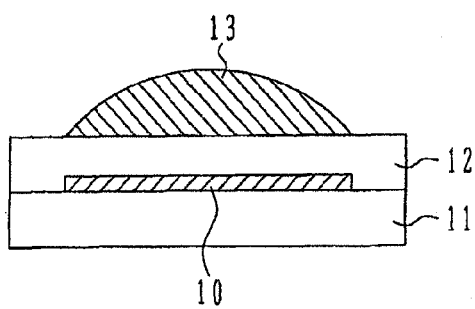
Figure 5D:
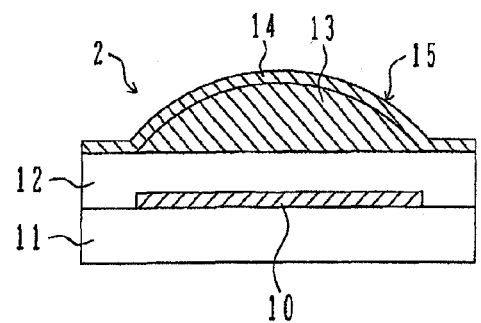

FIG. 5A to FIG. 5D are cross sectional views showing a fine mold according to a second embodiment of the present invention. A fine mold 2 is different from the first embodiment in a point that the fine mold 2 has gently curving concave and convex parts on the forming surface 15. The gently curving concave and convex parts of the forming surface 15 depend on a cross-sectional shape of the resin film 13. As same as the first embodiment, in the second embodiment, a dome-shaped resin film 13 is formed by exposing the photosensitive film 51 as shown in FIG. 5A and baking an non-exposing region 52 of the photosensitive film 51 to reflow as shown in FIG. 5C after developing the photosensitive film 51 as shown in FIG. 5B.

Figure 6A:
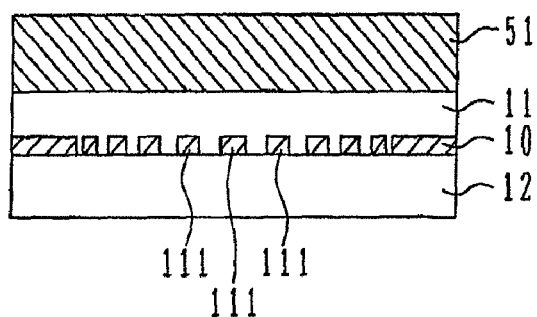
FIG. 6A to FIG. 6C are cross sectional views showing a fine mold according to a third embodiment of the present invention.
Figure 6B:
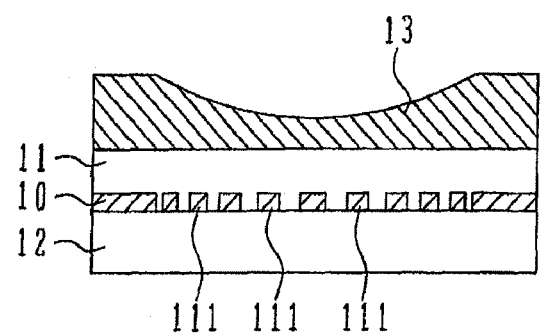
Figure 6C:
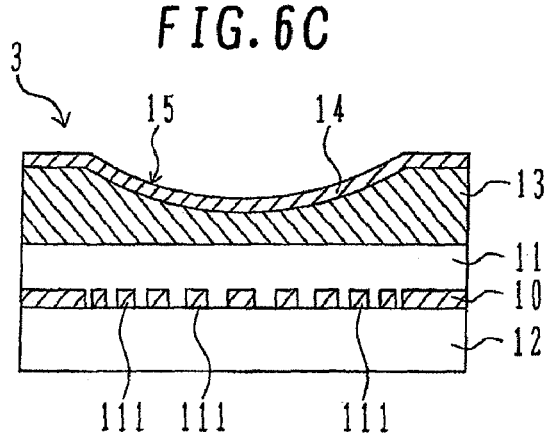

FIG. 6A to FIG. 6C are cross sectional views showing a fine mold according to a third embodiment of the present invention. A fine mold 3 is different from the second embodiment in a point that the light shielding unit 10 for forming the photosensitive film 51 is structured as a gray tone mask. A plurality of slits 111 with a width below a resolution of the exposure device are formed on the light shielding unit 10 that is the gradation mask. A half-exposing region is formed on the photosensitive film 51 corresponding to the width and the interval of the slits 111. The concave part and the convex part gently curving along the surface of the resin film 13 obtained by developing the photosensitive film 51 in FIG. 6B can be formed by setting the width and the interval of the slits 11 so that the exposed condition of the half-exposed region continuously changes. The photosensitive film 51 may be exposed from the transparent substrate 12 in a condition that a reflection prevention film is formed on the surface of the photosensitive film 51. Moreover, distribution of photosensitivity (reactivity) caused by a standing wave inside the photosensitivity film 51 may be dissolved by baking the photosensitive film 51 after exposing the photosensitive film 51. The forming surface 15 having an earthenware-mortar-shaped concave part can be formed by forming plurality of the slits 111 in concentric circles.

FIG. 7A to FIG. 7D are cross sectional views showing a manufacturing method of a fine mold according to a fourth embodiment of the present invention.

A fine mold 4 has a half tone mask 19, the resin film 13 formed by using the half tone mask 19 and the hard film 14 covering the resin film 13. The gently curving forming surface 15 is formed by the resin film 13 formed by using the half tone mask 19 that is the gradation mask. The manufacturing method of the fine mold 4 is as follow.

First, a transmission factor of an ultraviolet ray of the half tone mask 19 shown in FIG. 7A is set to be a desired value by an electron beam exposure. At this time, an earthenware-mortar-shaped concave part can be formed on the surface of the resin film 14 exposed and developed by using the half tone mask 19 as the mask by the exposure so that the transmission factor of the ultraviolet ray from the surface of the half tone mask 19 decreases in proportion to the distance from a certain point.

Next, as shown in FIG. 7B, the photosensitive film 51 is applied, and an ultra violet ray is irradiated from the reverse side (that is, the reverse side of the surface where the photosensitive film 51 is laminated) of the half tone mask 19. Then, the photosensitive film 51 is exposed corresponding to the light transmission factor of the half tone mask 19. The photosensitive film 51 may be exposed in a state of being formed the reflection prevention film on the surface of the photosensitive film 51.

Next, when the photosensitive film 51 is developed, as shown in FIG. 7C, the resin film whose surface gently curves is formed. The photosensitive film 51 may be baked in order to resolve distribution of the photosensitivity (reactivity) of the photosensitive film caused by the standing wave inside the photosensitive film 51 before developing.

Finally, when the hard film 14 is formed on the surface of the resin film 13, the fine mold 4 shown in FIG. 7D is completed.

In the fine mold 4, the half tone mask 19 and the resin film 13 are contacting with each other. That is, the deepest point of the resin film as a regeneration target film and the shallowest point of the half tone mask 19 as the light shielding unit to work as a mask for forming the resin film 13 are agreed with each other. Therefore, at the time of manufacturing and regenerating the fine mold 4, when the photosensitive film 51 is exposed from the reverse side of the half tone mask 19, that is, the reverse side of the photosensitive film 51, there will be no decline in a resolution caused by diffraction and dispersion of the ultraviolet ray.

FIG. 8A to FIG. 9D are cross sectional views showing a manufacturing method of a fine mold according to a fifth embodiment of the present invention. It is different from the first embodiment in a point that a fine mold 5 includes the light shielding unit 10 as the light shielding unit and the protection film 20 which are embedded in the transparent substrate 11. Moreover, it is different from the first embodiment in a point that the depth of the shallowest point of the light shielding unit 10 agrees with the depth of the deepest point of the resin film 13. That is, the light shielding unit 10 is jointed to the whole part of the wall of the concave part of the transparent substrate 11, and the concave part of the transparent substrate 11 is completely re-embedded by the protection film 20 formed on the light shielding unit 10. The manufacturing method of the fine mold 5 is as follow.

Figure 8A:
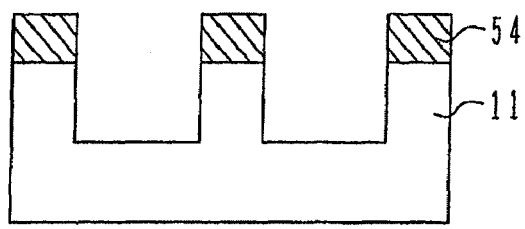
FIG. 8A to FIG. 8D are cross sectional views showing a manufacturing method of a fine mold according to a fifth embodiment of the present invention.

First, as shown in FIG. 8A, concave parts for embedding the light shielding unit are formed on the surface of the transparent substrate 11. For example, the concave parts may be formed by photolithography using the photoresist mask 54, and the concave parts may be formed by the laser-beam direct writing method.

Figure 8B:
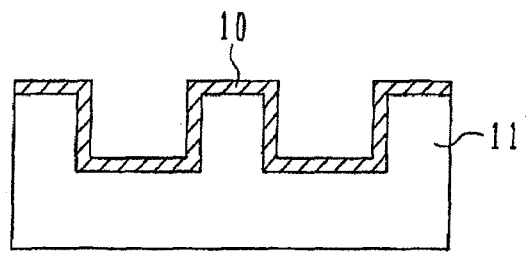

Next, as shown in FIG. 8B, the light shielding unit 10 is formed on the surface of the transparent substrate 11. The light shielding unit 10 works as a seed layer of the protection film 20 and as the light shielding unit, for example, the light shielding unit 10 is formed by laminating $TiN_x$ on the surface of the transparent substrate 11 by sputtering. An adhering layer made of Ti, Cr, etc. may be formed between the $TiN_x$ and the transparent substrate 11.

Figure 8C:
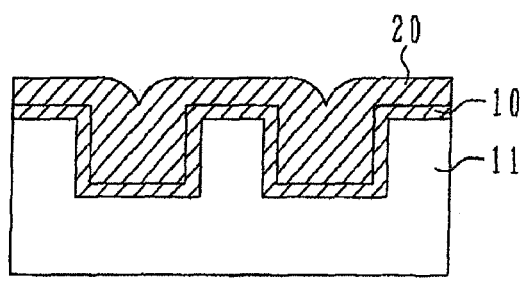
Figure 8D:
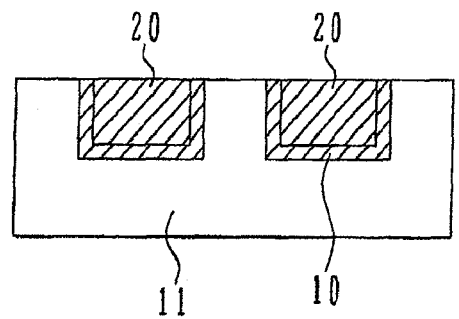

Then, as shown in FIG. 8C, the protection film 20 is formed on the surface of the light shielding unit 10. For example, the protection film 20 is formed by depositing W, Ta, Ti, Mo, Cu, TiN, TaN, MoN, etc. with a thickness of 50 µm by the CVD. The opaque protection film 20 works also as the light shielding unit. The protection film 20 may be formed by electrolysis plating of alloy such as NiP, NiW, NiCo, NiFe, NiMn, NiMo, etc. and metal such as Ni, Cr.

Thereafter, as shown FIG. in 8D, the protection film 20 and the light shielding unit 10 are removed until the transparent substrate 11 is exposed by grinding and polishing.

Figure 9A:
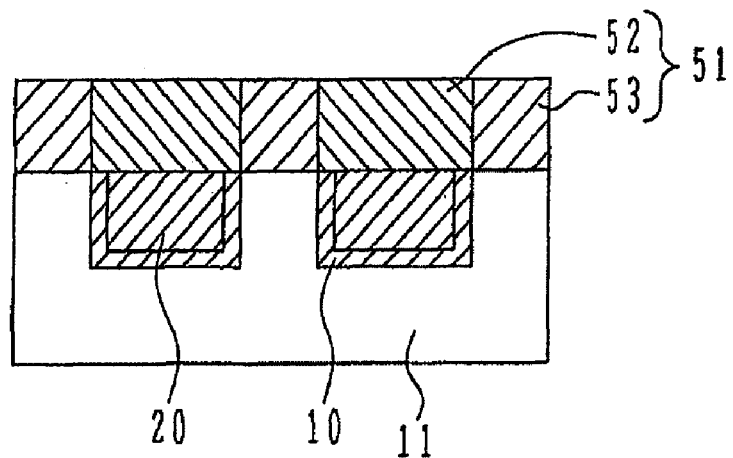
FIG. 9A and FIG. 9B are cross sectional views showing the manufacturing method of the fine mold according to the fifth embodiment of the present invention.
Figure 9B:
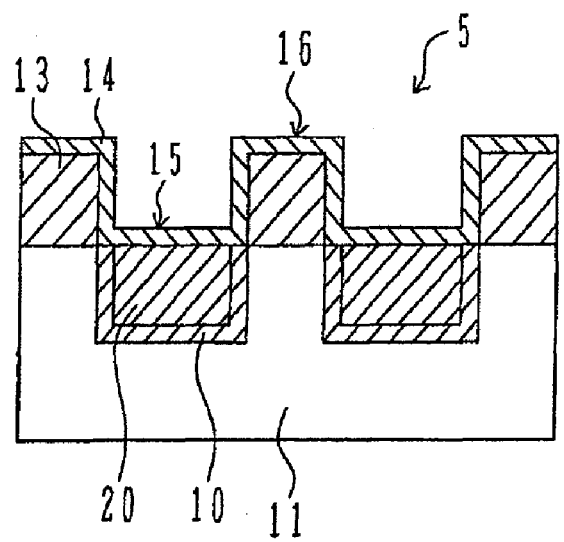

Finally, as same as the first embodiment, and as shown in FIG. 9A and FIG. 9B, when the resin film 13 and the hard film 14 are formed, the fine mold 5 is completed.

FIG. 10A to FIG. 11C are cross sectional views showing a manufacturing method of a fine mold according to a sixth embodiment of the present invention. It is different from the fifth embodiment in a point that the transparent substrate 11 of a fine mold 6 is made of a photosensitive glass having a crystallizing region 21 and non-crystallizing region 22. The crystallizing region 21 may be half-transparent or opaque. The manufacturing method of the fine mold 6 is as follow.

Figure 10A:
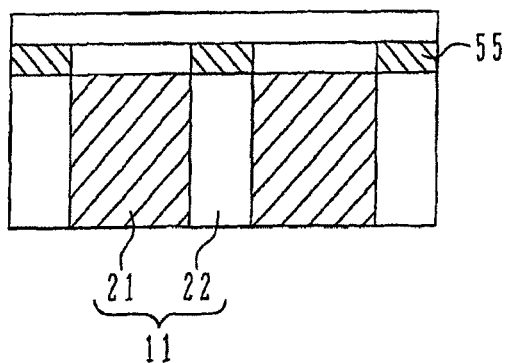
FIG. 10A to FIG. 10D are cross sectional views showing a manufacturing method of a fine mold according to a sixth embodiment of the present invention.

First, as shown in FIG. 10A, the transparent substrate 11 formed of the photosensitive glass is heated after exposing a part of the transparent substrate 11 by using, for example, the photo mask 55 having the light shielding unit (pattern) made of $CrO_2$ on the quartz substrate, and a crystallite is generated in the exposing region. The exposing region becomes a crystallization region 21. At this time, the crystallite is not generated in the unexposed region.

Figure 10B:
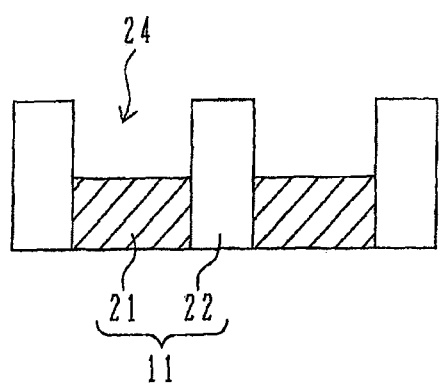

Next, as shown in FIG. 10B, concave parts 24 are formed by selectively etching the crystallizing region 21 of the transparent substrate 11 by using diluted hydrofluoric acid.

Figure 10C:
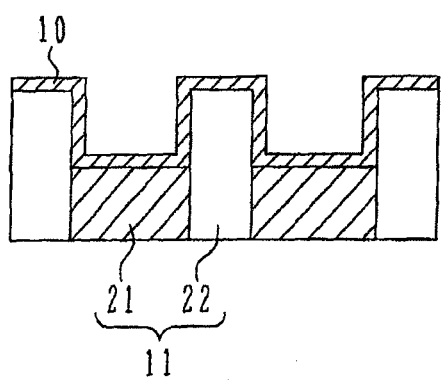

Then, as shown in FIG. 10C, the light shielding unit 10 is formed. For example, the light shielding unit 10 may be formed by accumulating Ni, Co, and Cu by electroless plating, or the light shielding unit 10 made of Ag may be formed by Tollens test.

Figure 10D:
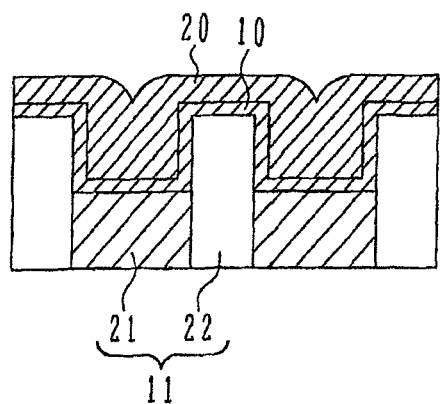

Thereafter, as shown in FIG. 10D, the protection film 20 made of low-melting point glass is formed on the light shielding unit 10, and the concave parts 24 are completely buried.

Then, the protection film 20 and the light shielding unit 10 are removed until the transparent substrate 11 is exposed by grinding and polishing.

Figure 11A:
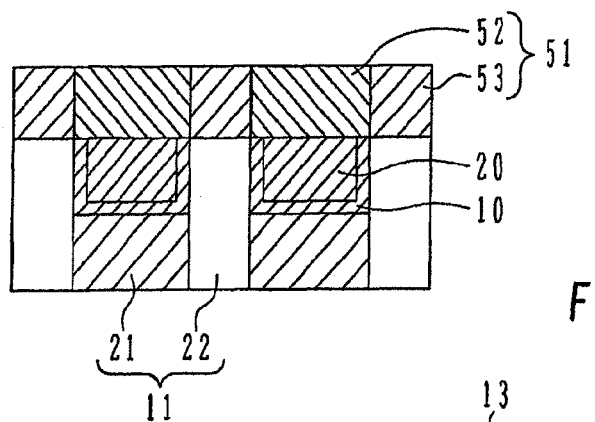
FIG. 11A to FIG. 11C are cross sectional views showing the manufacturing method of the fine mold according to the sixth embodiment of the present invention.
Figure 11B:
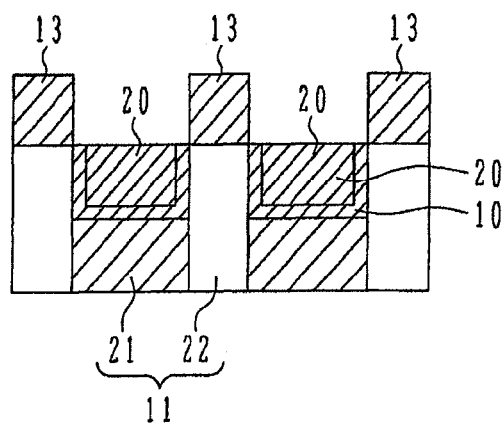
Figure 11C:
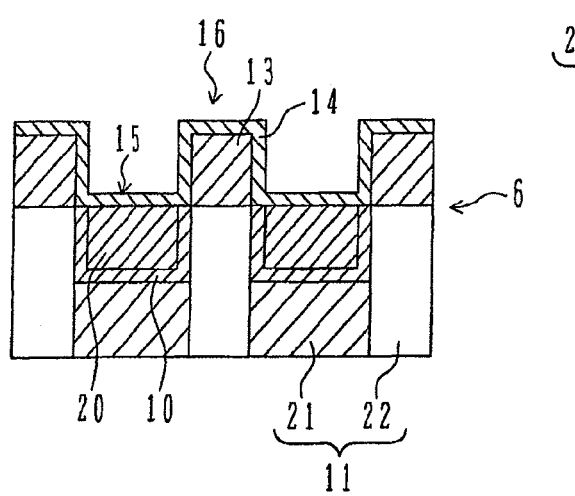

Finally, as same as the first embodiment, and as shown in FIG. 11A, FIG. 11B and FIG. 11C, when the resin film 13 and the hard film 14 are formed, the fine mold 6 is completed.

FIG. 12A to FIG. 12D are cross sectional views showing a manufacturing method of a fine mold according to a seventh embodiment of the present invention. It is different from the first embodiment in a point that the light shielding unit 10 of a fine mold 7 is exposed on the reverse side of the mold and that the transparent substrate 11 itself works as the protection film of the light shielding unit 10. The manufacturing method of the fine mold 7 is as follow.

Figure 12A:
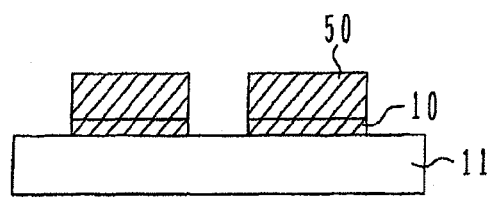
FIG. 12A to FIG. 12D are cross sectional views showing a manufacturing method of a fine mold according to a seventh embodiment of the present invention.

First, as same as the first embodiment, and as shown in FIG. 12A, the light shielding unit 10 is formed on the transparent substrate 11.

Figure 12B:
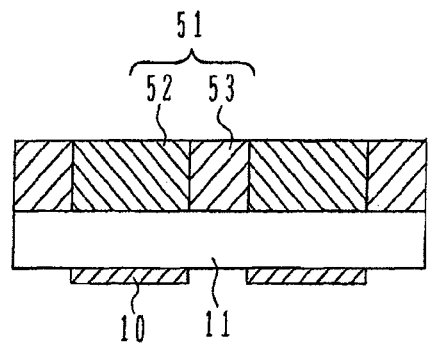
Figure 12C:
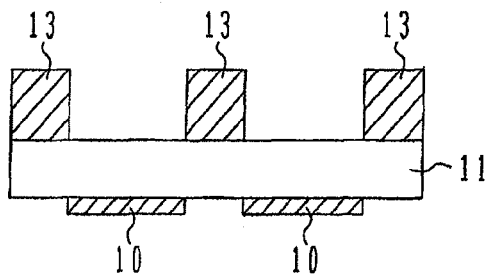
Figure 12D:
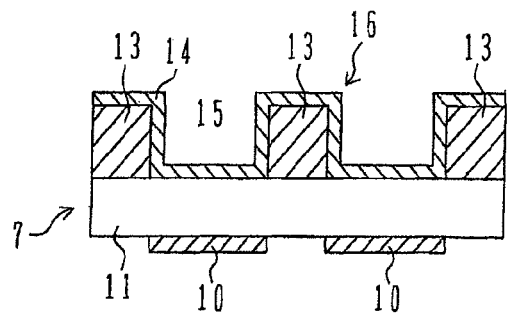

Next, as shown in FIG. 12B, the photosensitive film 51 is formed on the reverse side of the light shielding unit 10 of the transparent substrate 11, and an ultraviolet ray is irradiated from the light shielding unit 10 side to expose a part of the photosensitive film 51.

Then, as same as the first embodiment, unexposed region 52 of the photosensitive film 51 is removed, and the resin film 13 formed of the exposing region 53 is formed. Thereafter, when the hard film 14 is formed, the fine mold 7 is completed.

FIG. 13A to FIG. 14C are cross sectional views showing a manufacturing method of a fine mold according to an eighth embodiment of the present invention. The shallowest part of the light shielding unit 10 of a fine mold 8 is positioned at deeper than the deepest point of the resin film 13 that is the regeneration film, and it is different from other embodiments in a point that the decline of the resolution by those embodiments is structurally prevented.

For example, the light shielding unit 10 as the light shielding unit is connected with the bottom of the concave part of the transparent layer 27 as the reinforcement plate, and the concave part of the transparent layer 27 is completely buried with the transparent substrate 11 remained on the light shielding unit 10, and the depth of the shallowest part of the transparent substrate 11 is same as the depth of the deepest part of the resin film 13. The transparent substrate 11 works as the transparent protection film of the light shielding unit 10. The material of the transparent substrate 11 and the material of the transparent layer 27 are selected so that a refractive index of the transparent substrate 11 is smaller than a refractive index of the transparent layer 27.

As described in the above, a total internal reflection occurs on both interfaces (refer to FIG. 14A) at the time of exposing of the photosensitive film 51 by setting the refractive index of the transparent substrate 11 and the refractive index of the transparent layer 27. Therefore, the resolution will not decline even though the light shielding unit 10 is positioned at deeper than the resin film 13 that is the regenerating target film. The manufacturing method of the fine mold 8 is as follow.

First, the light shielding unit 10 is formed on the transparent substrate 11 as same as the first embodiment.

Figure 13A:
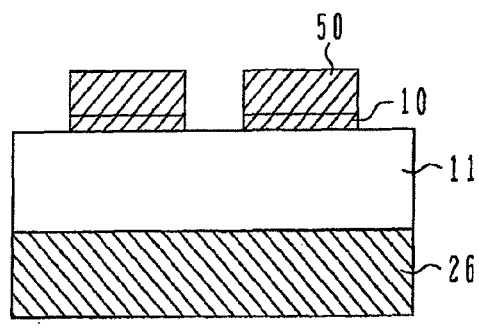
FIG. 13A to FIG. 13D are cross sectional views showing a manufacturing method of a fine mold according to an eighth embodiment of the present invention.

Next, as shown in FIG. 13A, a reinforcement substrate 26 is joined to the reverse side of the light shielding unit 10 of the transparent substrate 11. For example, the reinforcement substrate 26 made of glass, ceramics, metal or the likes is adhered to the transparent substrate 11. Moreover, a metal film made of Cu or Sn may be formed on the reverse of the transparent substrate 11 before forming the light shielding unit 10, and this metal film may be used as the reinforcement substrate 26.

Figure 13B:
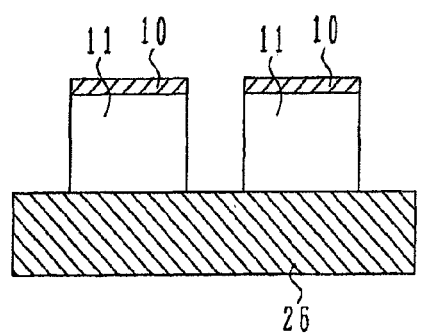

Next, as shown in FIG. 13B, a part of the transparent substrate 11 is removed by anisotropic etching by using the light shielding unit 10 as the mask. At this time, it is preferable to remove the transparent substrate 11 until the reinforcement substrate 26 is exposed; however, an ending point of the etching may be controlled to a depth not to expose the reinforcement substrate 26. For example, when the transparent substrate 11 is quartz or glass, the transparent substrate 11 is etched by RIE by using a gas of which main component is $CF_4$. Moreover, for example, when the transparent substrate 11 is resin, the transparent substrate 11 is etched by RIE by using a gas of which main component is $O_2$.

Figure 13C:
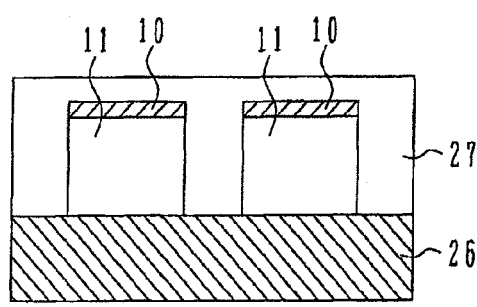

Next, as shown in FIG. 13C, the transparent layer 27 is formed to bury the transparent substrate 11 and the light shielding unit 10. Resin, glass, ceramics, clay, etc. may be used as the material of the transparent layer 27. After forming the transparent layer 27, it may be planarized by grinding, polishing and etching-back the surface.

Figure 13D:
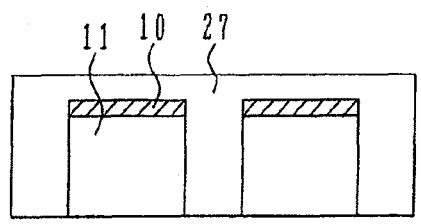

Then, as shown in FIG. 13D, the reinforcement substrate 26 is removed.

Figure 14A:
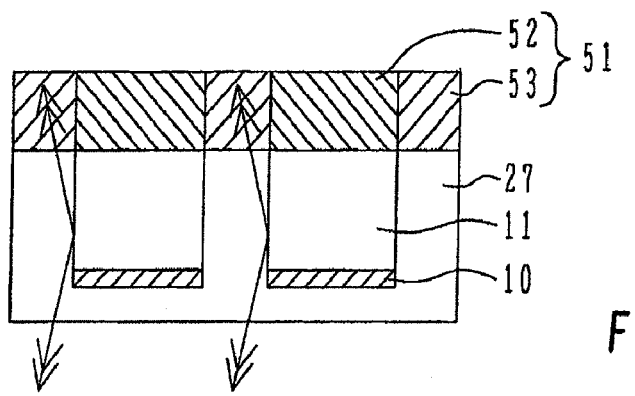
FIG. 14A to FIG. 14C are cross sectional views showing the manufacturing method of the fine mold according to the eighth embodiment of the present invention.
Figure 14B:
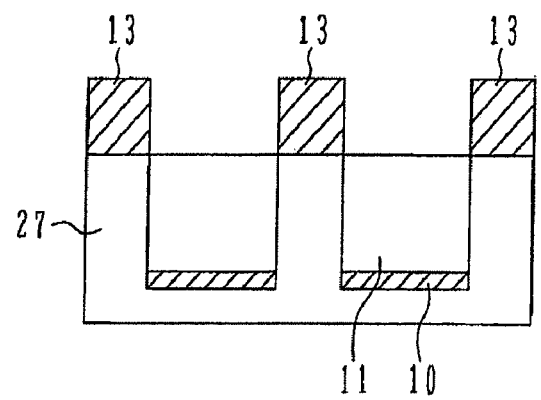
Figure 14C:
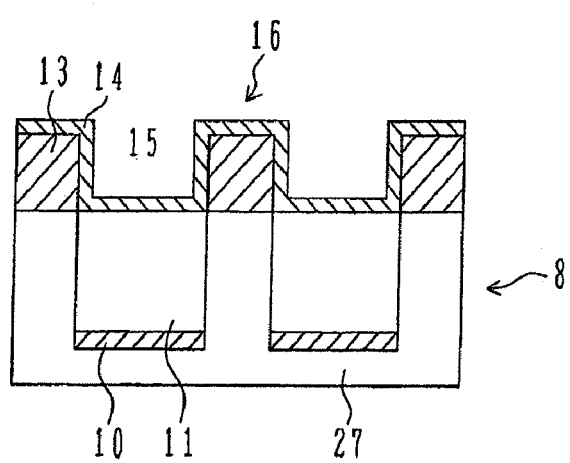

Thereafter, as same as the first embodiment, and as shown in FIG. 14A, FIG. 14B and FIG. 14C, when the resin film 13 and the hard film 14 are formed, the fine mold 8 is completed.

The present invention has been described in connection with the preferred embodiments. The invention is not limited only to the above embodiments. It is apparent that various modifications, improvements, combinations, and the like can be made by those skilled in the art.

For example, the hard film 14 is not always necessary, and the protection film 12 is not always necessary. Moreover, the resin film formed of the photosensitive film does not have to work as the regeneration target film, but the regeneration target film may be formed by a lift-off process by using the resin film as the mask. Moreover, materials of the substrate and the film composing a fine mold according to the embodiments are arbitrary selected corresponding to the functions to be required for the fine mold, and it is natural that the forming method and the forming conditions of the films are arbitrary selected depending on the material of the film and the characteristics of the film that has already been formed.

Moreover, it is natural that the shapes and the sizes of the forming surface of the fine molds are designed corresponding to the shapes of what to be formed by using those molds and the design rules. Furthermore, although the explanations of the regeneration method of the fine mold according to the embodiments of the present invention except the first embodiment have been omitted, it is same as the first embodiment in a point that the regenerating target film and the hard film are regenerated by using the light shielding unit after removing the regenerating target film and the hard film, and the fine mold according to each embodiment can be regenerated by executing the latter manufacturing method explained in each embodiment.

What is claimed is:

1. A fine mold, comprising: a regeneration target film forming a convex part of a formation surface; and a light shielding unit that is configured deeper than a bottom of the formation surface and that regenerates the regeneration target film, wherein the light shielding unit comprises a pattern that corresponds to desired features of the formation surface and wherein the desired features are the same features present in the original formation surface.

2. The fine mold according to claim 1, wherein the light shielding unit is formed of an opaque film.

3. The fine mold according to claim 1, wherein the light shielding unit is formed of a gradation mask.

4. The fine mold according to claim 1, wherein shallowest depth of the light shielding unit is same as deepest depth of the regeneration target film.

5. The fine mold according to claim 1, further comprising a transparent protection film that is harder than the regeneration target film and configured between the forming surface and the light shielding unit.

6. The fine mold according to claim 1, further comprising a transparent reinforcement plate having a concave part in which the light shielding unit is embedded, and wherein
   the protection film is embedded in the reinforcement plate between the light shielding unit and the forming surface and formed of transparent material having a lower refractive index than the reinforcement plate.

7. The fine mold according to claim 1, further comprising a transparent reinforcement plate configured at a deeper place than the light shielding unit.

* * * * *